(12) United States Patent
Wang et al.

(10) Patent No.: US 10,790,212 B2
(45) Date of Patent: Sep. 29, 2020

(54) METHOD OF MANUFACTURING PACKAGE STRUCTURE

(71) Applicant: Taiwan Semiconductor Manufacturing Co., Ltd., Hsinchu (TW)

(72) Inventors: Po-Han Wang, Hsinchu (TW); Hung-Jui Kuo, Hsinchu (TW); Yu-Hsiang Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/675,227

(22) Filed: Nov. 6, 2019

(65) Prior Publication Data

US 2020/0075447 A1    Mar. 5, 2020

Related U.S. Application Data

(62) Division of application No. 15/846,232, filed on Dec. 19, 2017, now Pat. No. 10,522,440.

(Continued)

(51) Int. Cl.
*H01L 23/48* (2006.01)
*H01L 23/31* (2006.01)
*H01L 23/00* (2006.01)
*H01L 21/56* (2006.01)
*H01L 21/3105* (2006.01)

(52) U.S. Cl.
CPC .... *H01L 23/3135* (2013.01); *H01L 21/31053* (2013.01); *H01L 21/561* (2013.01); *H01L 21/568* (2013.01); *H01L 23/3128* (2013.01); *H01L 24/05* (2013.01); *H01L 24/11* (2013.01); *H01L 24/13* (2013.01); *H01L 24/19* (2013.01); *H01L 24/20* (2013.01); *H01L 2224/0231* (2013.01); *H01L 2224/02381* (2013.01); *H01L 2224/0401* (2013.01); *H01L 2224/04105* (2013.01); *H01L 2224/12105* (2013.01); *H01L 2224/13144* (2013.01); *H01L 2224/13147* (2013.01); *H01L 2924/014* (2013.01); *H01L 2924/181* (2013.01); *H01L 2924/18162* (2013.01); *H01L 2924/37001* (2013.01)

(58) Field of Classification Search
CPC ... H01L 23/3135; H01L 21/568; H01L 24/19; H01L 24/20; H01L 2224/0231
USPC .................................. 257/783, 790
See application file for complete search history.

(56) References Cited

U.S. PATENT DOCUMENTS 5,952,718 A * 9/1999 Ohtsuka ................ H01L 21/563
257/737
5,959,363 A * 9/1999 Yamada .............. H01L 23/3121
257/787

(Continued)

*Primary Examiner* — Nitin Parekh
(74) *Attorney, Agent, or Firm* — JCIPRNET

(57) ABSTRACT

A method of manufacturing a package structure includes the following processes. An adhesive layer is formed on a carrier. A die is attached to the carrier through the adhesive layer. A protection layer is formed to at least cover a sidewall and a portion of a top surface of the adhesive layer on an edge of the carrier. An encapsulant is formed over the carrier to laterally encapsulate the die. A redistribution layer (RDL) structure is formed on the die and the encapsulant. A connector is formed to electrically connect to the die through the RDL structure. The carrier is released.

20 Claims, 12 Drawing Sheets

Related U.S. Application Data

(60) Provisional application No. 62/582,331, filed on Nov. 7, 2017.

(56) References Cited

U.S. PATENT DOCUMENTS

| | | | |
|---|---|---|---|
| 6,294,405 B1* | 9/2001 | Higgins | H01L 23/3114 |
| | | | 438/108 |
| 8,338,945 B2* | 12/2012 | Yu | H01L 24/96 |
| | | | 257/737 |
| 8,778,735 B1* | 7/2014 | Xue | H01L 21/304 |
| | | | 257/622 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,978,658 B2* | 5/2018 | Suthiwongsunthorn | |
| | | | H01L 21/566 |
| 2013/0037935 A1* | 2/2013 | Xue | H01L 21/76898 |
| | | | 257/737 |
| 2014/0138855 A1* | 5/2014 | Van Gemert | H01L 23/31 |
| | | | 257/788 |

* cited by examiner

METHOD OF MANUFACTURING PACKAGE STRUCTURE

CROSS-REFERENCE TO RELATED APPLICATION

This is a divisional application of and claims the priority benefit of U.S. application Ser. No. 15/846,232, filed on Dec. 19, 2017, now allowed. The prior U.S. application Ser. No. 15/846,232 claims the priority benefit of U.S. provisional application Ser. No. 62/582,331, filed on Nov. 7, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
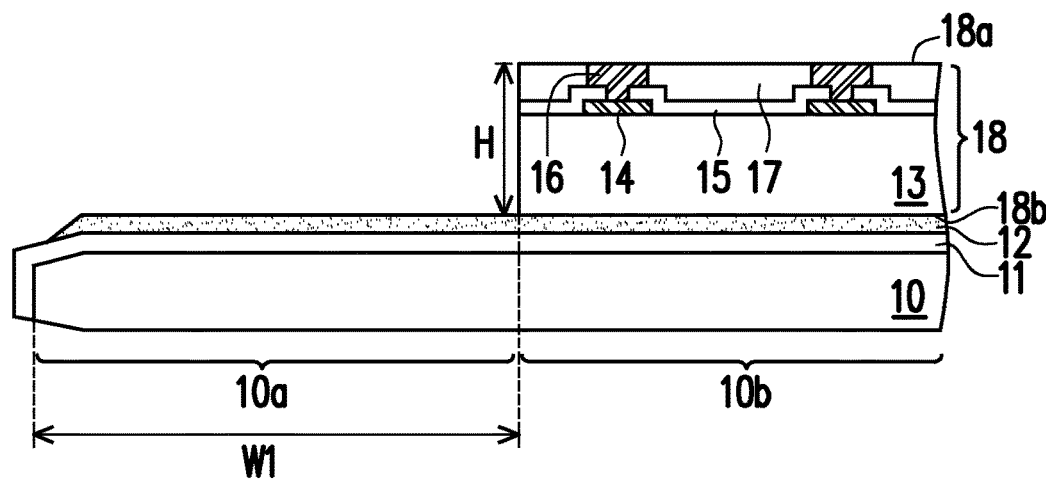
FIG. 1A to FIG. 1I are schematic cross-sectional views illustrating a method of forming a package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic cross-sectional views illustrating a method of forming a package structure according to a first embodiments of the disclosure. FIG. 3A to FIG. 3D are top views illustrating a method of forming a package structure according to some embodiments of the disclosure. In some embodiments, FIGS. 1A to 1D are respectively the cross-sectional views along A-A' line in FIGS. 3A to 3D.

Figure 3A:
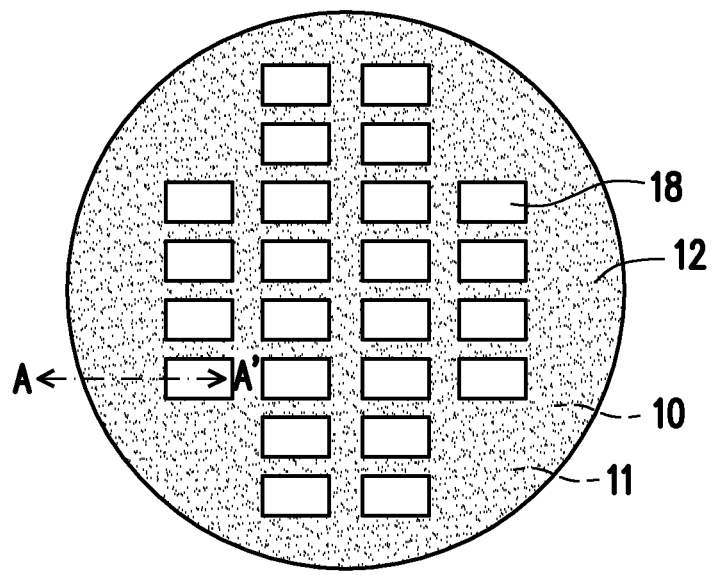
FIG. 3A to FIG. 3D are top views illustrating a method of forming a package structure according to some embodiments of the disclosure.

Referring to FIG. 1A and FIG. 3A, a carrier 10 is provided. The carrier 10 may be a glass carrier, a ceramic carrier, or the like. In some embodiments, as shown in FIG. 3A, the carrier 10 has a same shape as a wafer, such as rounded. A de-bonding layer 11 is formed on the carrier 10 by, for example, a spin coating method. In some embodiments, the size of the de-bonding layer 11 is slightly larger than the size of the carrier 10, so as to cover the top surface and sidewalls of the carrier 10. The de-bonding layer 11 may be formed of an adhesive such as an Ultra-Violet (UV) glue, a Light-to-Heat Conversion (LTHC) glue, or the like, or other types of adhesives, for example. The de-bonding layer 11 is decomposable under the heat of light to thereby release the carrier 10 from the overlying structures that will be formed in subsequent steps.

Referring to FIG. 1A and FIG. 3A, an adhesive layer 12 is formed on the de-bonding layer 11. The adhesive layer 12 includes die attach film (DAF), silver paste, or the like. In some embodiments, the adhesive layer 12 extends on the whole carrier 10, the size of the adhesive layer 12 is substantially equal to the size of the carrier 10. In some embodiments, the adhesive layer 12 covers a portion of the top surface of the de-bonding layer 11. In some embodiments, the sidewall and the corner of the de-bonding layer 11 is not covered by the adhesive layer 12, but exposed.

Referring to FIG. 1A, in some embodiments, the carrier 10 includes an edge region 10a (or referred as edge) and a die-attach region 10b. The edge 10a refers to a region adjacent to the end of the carrier 10, and has no die attached thereon in the subsequently process. In some embodiments, the width W1 of the edge 10a ranges from 1 mm to 10 mm. The die-attach region 10b refers to a region having one or more dies attached thereon in the subsequent process.

Still referring to FIG. 1A and FIG. 3A, one or more dies 18 are attached to the carrier 10 through the adhesive layer 12. The dies 18 are placed on the die-attach region 10b of the carrier 10. In some embodiments, the die 18 is one of a plurality of dies cut apart from a wafer, for example. The die 18 may be an application-specific integrated circuit (ASIC) chip, an analog chip, a sensor chip, a wireless and radio frequency chip, a voltage regulator chip or a memory chips, for example. The number of the die 18 shown in FIG. 1A and FIG. 3C is merely for illustration, and the disclosure is not limited thereto. As shown in FIG. 3A, in some embodiments, a plurality of dies 18 are mounted on the carrier 10 and may be arranged as an array, the dies 18 may be the same types of dies or the different types of dies. In some embodiments, the height H (or referred as thickness) of the die 18 ranges from 500 μm to 900 μm, for example. In some embodiments, the height H of the die 18 is greater than or equal to 600 μm.

Referring to FIG. 1A, in some embodiments, the die 18 includes a substrate 13, a plurality of pads 14, a passivation layer 15, a plurality of connectors 16 and a passivation layer 17. The pads 14 may be a part of an interconnection structure (not shown) and electrically connected to the active devices, passive devices or integrated circuit devices (not shown) formed on the substrate 13. The passivation layer 15 is formed over the substrate 13 and covers a portion of the pads 14. A portion of the pads 14 is exposed by the passivation layer 15 and serves as an external connection of the die 18. The connectors 16 are formed on and electrically connected to the pads 14 not covered by the passivation layer 15. The connector 16 includes solder bumps, gold bumps, copper bumps, copper posts, copper pillars, or the like. The passivation layer 17 is formed over the passivation layer 15 and aside the connectors 16 to cover the sidewalls of the connectors 16. The passivation layers 15 and 17 respectively include an insulating material such as silicon oxide, silicon nitride, polymer, or a combination thereof. The materials of the passivation 15 and the passivation layer 17 may be the same or different. In some embodiments, the top surface of the passivation layer 17 is substantially level with the top surface of the connectors 16.

The die 18 has a first surface 18a (or referred as front surface) and a second surface 18b (or referred as back surface) opposite to each other. The first surface 18a is an active surface of the die 18. In some embodiments, the first surface 18a is formed of the top surface of the passivation layer 17 and the top surfaces of the connectors 16. The second surface 18b is a surface of the substrate 13. In some embodiments, as shown in FIG. 1A, the first surface 18a of the die 18 is upward, and the second surface 18b of the die 18 is attached to the adhesive layer 12, but the disclosure is not limited thereto. In some other embodiments, the first surface 18a of the die 18 is attached to the adhesive layer 12, and the second surface 18b of the die 18 is upward (not shown).

Figure 1B:
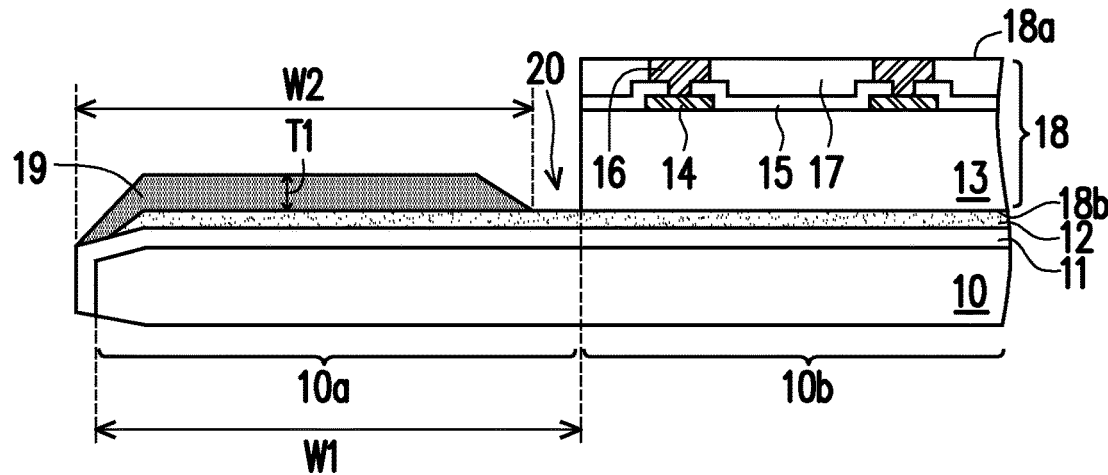
Figure 3B:
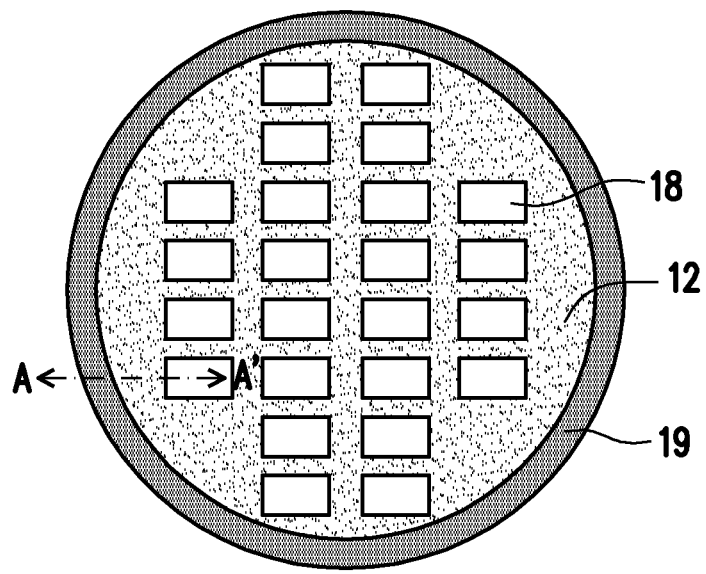
Figure 3C:
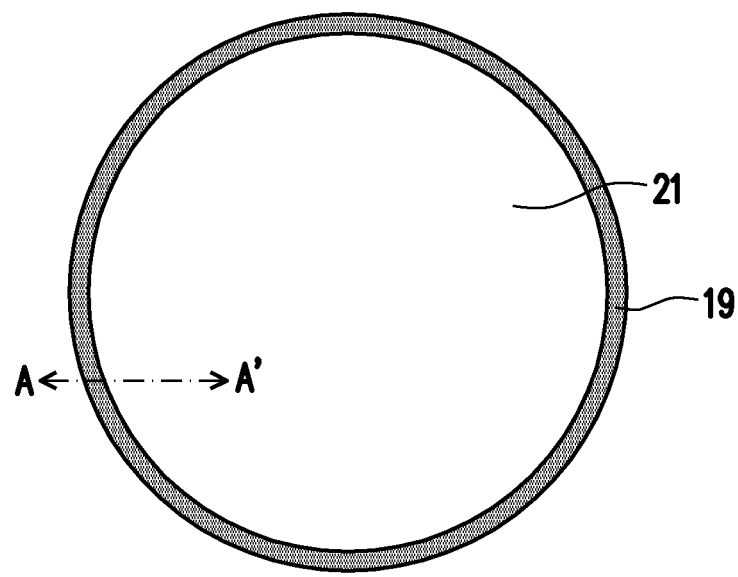

Referring to FIG. 1B and FIG. 3B, in some embodiments, a protection layer 19 is formed over the edge 10a of the carrier 10, so as to cover the adhesive layer 12 on the edge 10a of the carrier 10. The material of the protection layer 19 is different from the adhesive layer 12. In some embodiments, the protection layer 19 includes an inorganic material, an organic material, or a combination thereof. The inorganic material is, for example, silicon oxide, silicon nitride, silicon oxynitride, or a combination thereof. The organic dielectric material includes polymer, such as polybenzoxazole (PBO), polyimide (PI), benzocyclobutene (BCB), a combination thereof, or the like. The protection layer 19 may be formed by suitable fabrication technique, such as a spin-coating process, but the disclosure is not limited thereto. In some embodiments, after the spin-coating process is performed, a soft-bake process is further performed. The thickness T1 and the width W2 of the protection layer 19 may be adjusted by controlling the process condition (such as spin speed) of the spin coating process. In some embodiments, the thickness T1 of the protection layer 19 ranges from 5 μm to 20 μm. In an exemplary embodiment, the thickness T1 of the protection layer 19 is about 5.8 μm. The width W2 of the protection layer 19 may be less than, equal to, or slightly larger than the width W1 of the edge 10a of the carrier 10.

Still referring to FIG. 1B and FIG. 3B, in some embodiments, the protection layer 19 covers a portion of the top surface of the adhesive layer 12 on the edge 10a of the carrier 10, and is not in contact with the die 18. In other words, a gap 20 is existed between the protection layer 19 and the die 18, exposing a portion of the top surface of the adhesive layer 12, but the disclosure is not limited thereto. The sidewalls of the protection layer 19 may be straight or inclined. The protection layer 19 may be any shape, as long as it at least covers the sidewall and a portion of the top surface of the adhesive layer 12 on the edge 10a of the carrier 10.

Figure 1C:
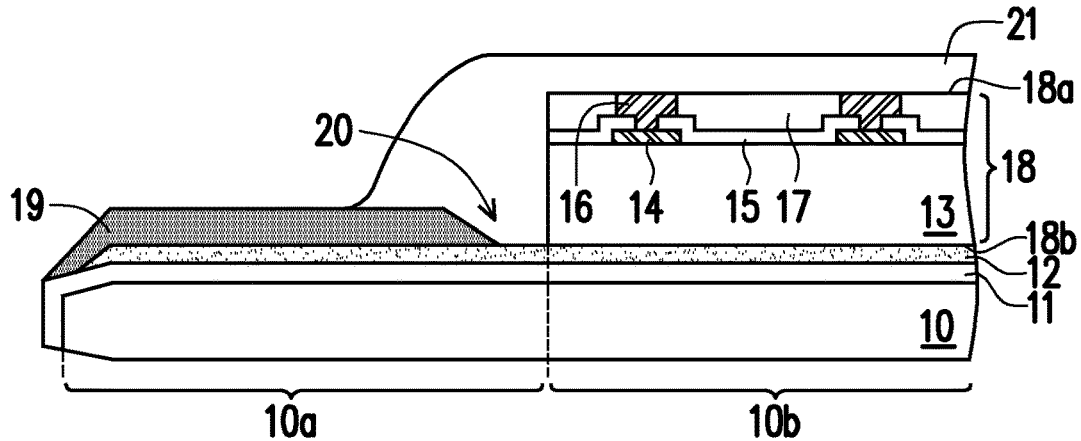

Referring to FIG. 1C and FIG. 3C, an encapsulant material layer 21 is formed over the carrier 10 and the die(s) 18, at least encapsulating sidewalls and top surfaces of the die 18, and the top surface of the adhesive layer 12 exposed by the gap 20. In some embodiments, the material of the encapsulant material layer 21 is different from the material of the protection layer 19. In some other embodiments, the material of the encapsulant material layer 21 is the same as the material of the material of the protection layer 19. In some embodiments, the encapsulant material layer 21 includes a molding compound, a molding underfill, a resin such as epoxy, a combination thereof, or the like. In some embodiments, the encapsulant material layer 21 includes a photo-sensitive material such as PBO, PI, BCB, a combination thereof, or the like, which may be easily patterned by exposure and development processes. In alternative embodiments, the encapsulant material layer 21 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant material layer 21 is formed by a suitable fabrication technique such as molding, spin-coating, lamination, deposition, or similar processes. In some embodiments in which the encapsulant material layer 21 is formed by molding or spin-coating, a curing process is further performed after the molding or spin-coating is performed.

In some embodiments, the area of the encapsulant material layer 21 is less than the area of the carrier 10. That is to say, a portion of the edge 10a of the carrier 10 is not covered by the encapsulant material layer 21. The encapsulant material layer 21 is formed with a shape the same as or different from the shape of the carrier 10 from the top view.

Figure 1D:
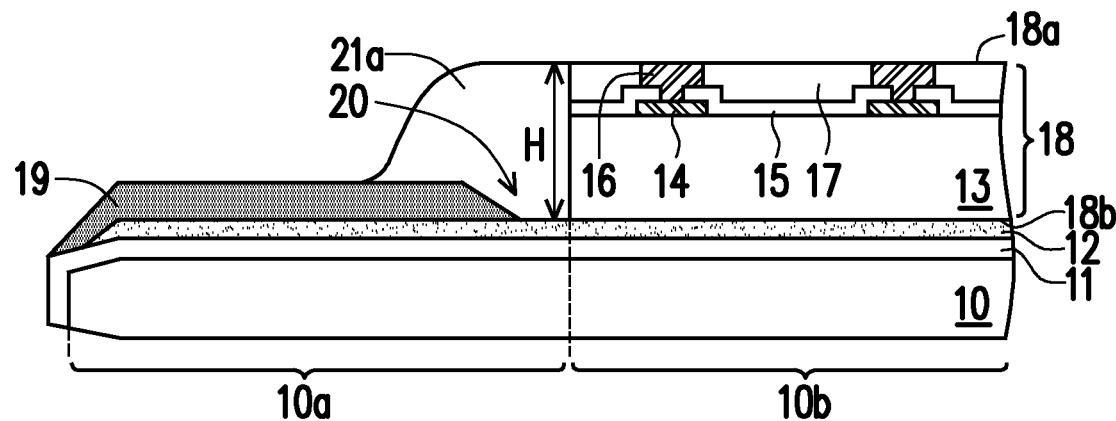
Figure 3D:
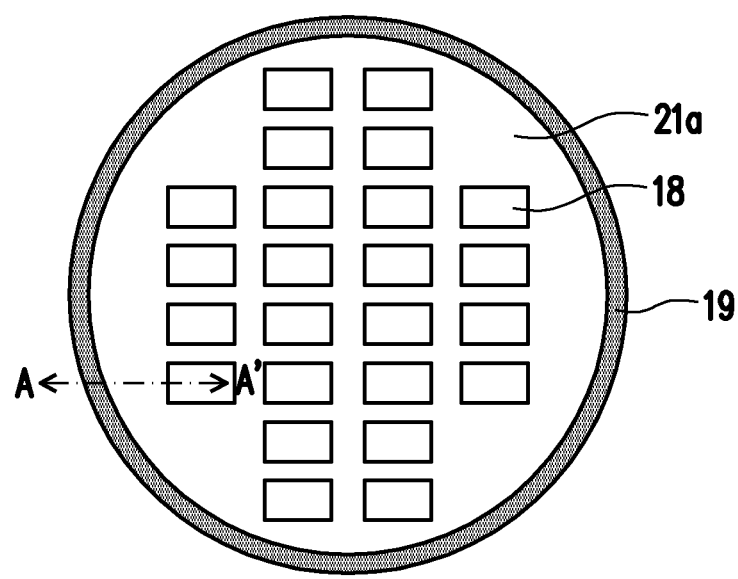

Referring to FIG. 1D and FIG. 3D, thereafter, a planarization process is performed to remove a portion of the encapsulant material layer 21, such that the first surface 18a of the die 18 are exposed, and an encapsulant 21a is formed. The planarization process includes a grinding process, a polishing process such as chemical mechanical polishing process, or the like, for example. In some embodiments, the top surface of the encapsulant 21a is level with the first surface 18a of the die 18. In some embodiments in which the second surface 18b of the die 18 is upward, a portion of the substrate 13 of the die 18 may be removed during the planarization process, such that the height H of the die 18 is reduced (not shown). In some embodiments, the height H of the die 18 may be reduced by 10 µm to 20 µm.

Figure 4A:
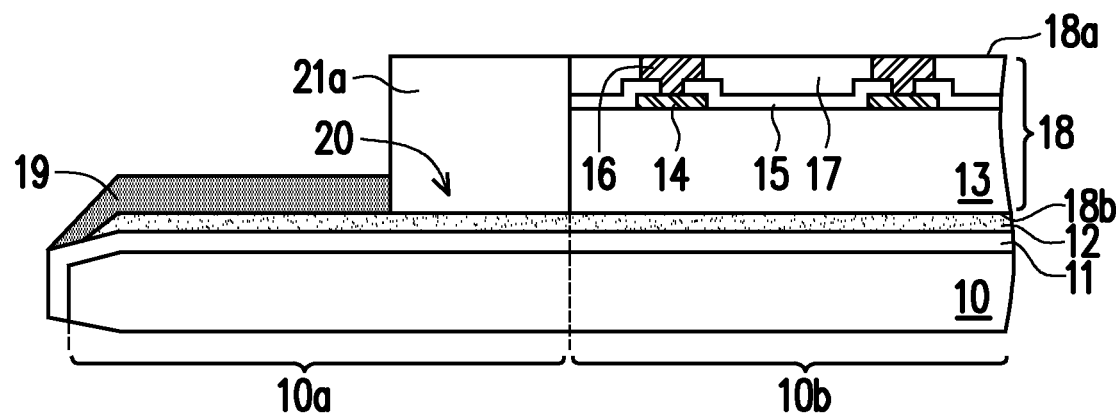
FIG. 4A and FIG. 4B illustrate examples of the protection layer and the encapsulant of a package structure according to some embodiments of the disclosure.

Referring to FIG. 1D, the encapsulant 21a is disposed over the carrier 10 and aside the die 18, encapsulating the sidewalls of the die 18. In some embodiments, the sidewall of the encapsulant 21a is inclined, but the disclosure is not limited thereto. In some other embodiments, the sidewall of the encapsulant 21a may be straight (FIG. 4A). In some embodiments in which the encapsulant material layer 21 is formed by a molding process, the shape of the encapsulant 21a is dependent on the mold used in the molding process.

In some embodiments in which the gap 20 is existed between the protection layer 19 and the die 18, the encapsulant 21a fills in the gap 20, so as to cover the top surface of the adhesive layer 12 exposed by the gap 20. In some embodiments, the encapsulant 21a also covers a sidewall and a portion of the top surface of the protection layer 19. In other words, a portion of the protection layer 19 is sandwiched between the encapsulant 21a and the adhesive layer 12. The adhesive layer 12 on the edge 10a of the carrier 10 is completely covered by and in contact with the protection layer 19 and the encapsulant 21a, and the sidewall of the die 18 is encapsulated by the encapsulant 21a. In some embodiments, the bottom surface of protection layer 19, the bottom surface of the encapsulant 21a and the bottom surface of the die 18 are coplanar with each other, but the disclosure is not limited thereto. The structural characteristics of the protection layer 19 and the encapsulant 21a are not limited to those described above.

Figure 4B:
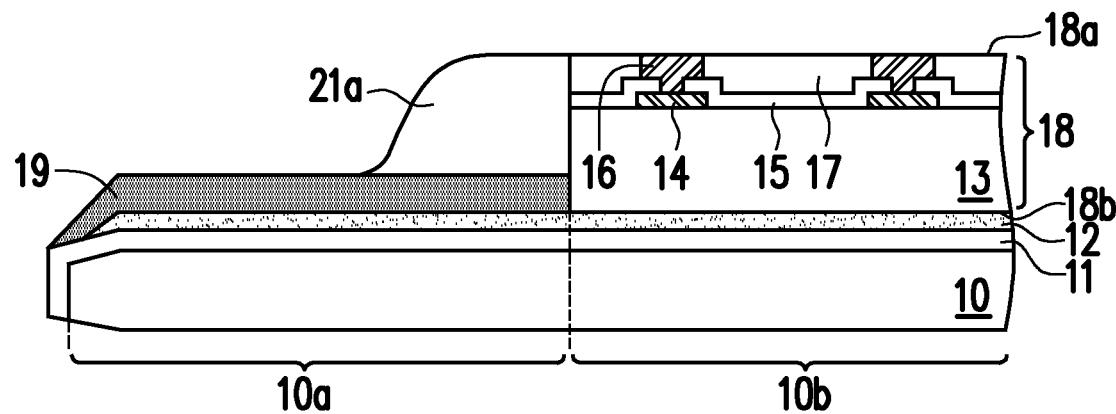

FIG. 4A and FIG. 4B illustrate examples of the protection layer and the encapsulant of a package structure according to some other embodiments of the disclosure.

Referring to FIG. 4A, in some embodiments, the top surface of the protection layer 19 is not covered by the encapsulant 21a. Specifically, the encapsulant 21a fills in the gap 20 to cover the top surface of the adhesive layer 12 exposed by the gap 20, and contacts with a sidewall of the protection layer 19. The top surface of the adhesive layer 12 on the edge 10a of the carrier 10 is completely covered by the protection layer 19 and the encapsulant 21a. The sidewall of the protection layer 19 and the sidewall of the encapsulant 21a shown in FIG. 4A are straight, but the disclosure is not limited thereto. In some other embodiments, the sidewall of the protection layer 19 and the sidewall of the encapsulant 21a in this example may also be inclined (not shown).

Referring to FIG. 4B, in some other embodiments, the protection layer 19 further extends to contacts with a portion of the sidewall of the die 18, that is, no gap is existed between the protection layer 19 and the die 18. The encapsulant 21a is formed on the protection layer 19, contacting with and encapsulating another portion of the sidewall of the die 18. A portion of the protection layer 19 is sandwiched between the encapsulant 21a and the adhesive layer 12. In other words, the encapsulant 21a is separated from the adhesive layer 12 by the protection layer 19 therebetween. The adhesive layer 12 on the edge 10a of the carrier 10 is completely covered by and in contact with the protection layer 19. The sidewall of the die 18 is covered by the protection layer 19 and the encapsulant 21a.

Referring to FIG. 1D, FIG. 4A and FIG. 4B, the protection layer 19 and the encapsulant 21a may have inclined sidewall or straight sidewall. The width of the protection layer 19 may be adjusted by controlling the process condition as described above. Actually, the shapes, the sizes of the protection layer 19 and the encapsulant 21a, and how much the protection layer 19 is covered by the encapsulant 21a are not limited to those shown in FIGS. 1D, 3D, 4A and 4B, as long as the adhesive layer 12 on the edge 10a of the carrier 10 is completely covered by the protection layer 19 or/and the encapsulant 21a.

Figure 1E:
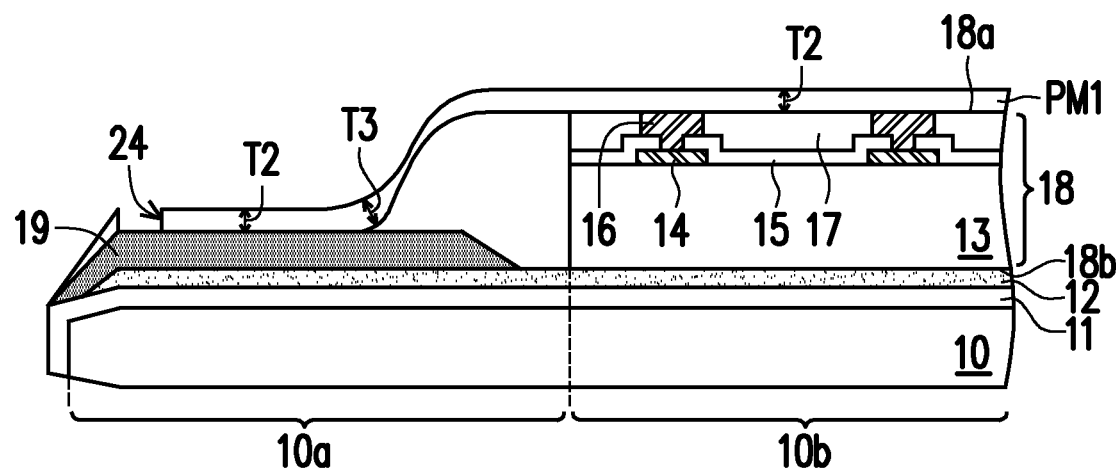

Referring to FIG. 1E, thereafter, a polymer layer PM1 is formed over the carrier 10 and the die 18. In some embodiments, the material of the polymer layer PM1 may be the same as or different from the material of the protection layer 19. In some embodiments, the polymer layer PM1 includes a photo-sensitive material such as PBO, PI, BCB, a combination thereof or the like. The polymer layer PM1 may be formed by a suitable fabrication technique, such as chemical vapor deposition, spin coating, or lamination.

In some embodiments in which the polymer layer PM1 is formed by a spin coating process, the spin coating process is performed at a high spin speed. In some embodiments, the spin speed ranges from 2000 rpm to 3000 rpm. The thickness T2 of the polymer layer PM1 is dependent on the spin speed. In some embodiments, the thickness T2 of the polymer layer PM1 ranges from 3 µm to 10 µm. In some other embodiments, the thickness T2 of the polymer layer PM1 ranges from 4 µm to 6 µm. Herein, the thickness T2 referred to the thickness of the portion (that is, the horizontal portion) of the polymer layer PM1 on the first surface 18a of the die 18 and on the top surface of the protection layer 19. In some embodiments, the thickness of the polymer layer PM1 on the sidewall of the encapsulant 21a is not uniform. For example, the polymer layer PM1 has a thicker region at the bottom of the sidewall of the encapsulant 21a, and has a thinner region on the middle region or a region adjacent to the middle region of the sidewall of the encapsulant 21a. In an exemplary embodiment, the thickness T3 of the polymer layer PM1 in the thicker region is about 20 µm.

In some embodiments in which the protection layer 19 comprises a similar material (such as, polymer) as that of the polymer layer PM1, the thickness of the polymer on the adhesive layer 12 over the edge 10a of the carrier 10 (that is, the sum of the thickness of the polymer layer PM1 and the thickness of the protection layer 19) is thicker than the polymer on the first surface 18a of the die 18 (that is, the thickness of the polymer layer PM1).

Still referring to FIG. 1E, in some embodiments in which the spin coating process is performed at a high spin speed to form the polymer layer PM1, the polymer layer PM1 may include a defect region 24 over the edge 10a of the carrier 10. The defect region 24 is an opening exposing a portion of the top surface of the protection layer 19. In some embodiments, the position and the structural characteristics of the defect region 24 are related to spin speed and the shape of the encapsulant 21a. The specific position, the size, the shape and the number of the defect region 24 shown in FIG. 1E are merely for illustration, and the disclosure is not limited thereto. The adhesive layer 12 on the edge 10a of the carrier 10 is completed covered and protected by the protection layer 19 and the encapsulant 21a, the adhesive layer 12 is not exposed by the defect region 24. Therefore, the problem that may occur due to exposed adhesive layer in the subsequent processes is avoided.

Figure 1F:
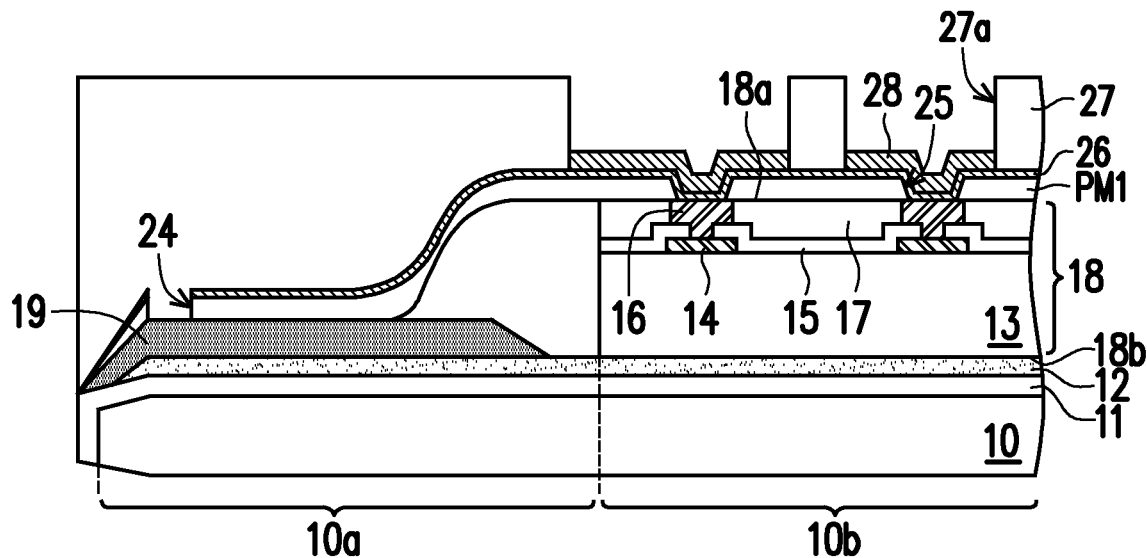
Figure 1G:
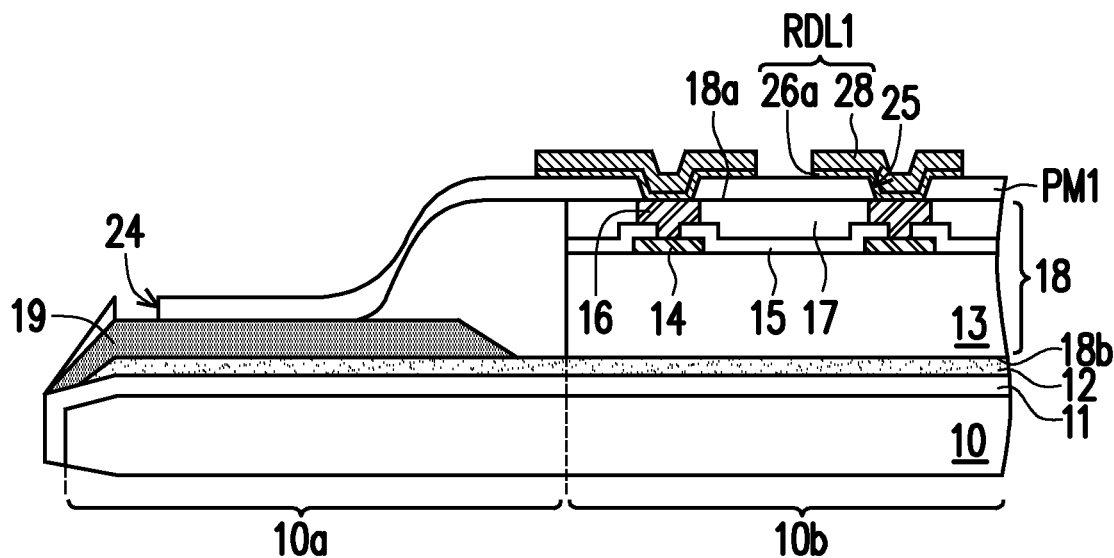

Referring to FIG. 1F and FIG. 1G, a redistribution layer RDL1 including a seed layer 26a and a conductive layer 28 is then formed on the polymer layer PM1. The redistribution layer RDL1 penetrates through the polymer layer PM1 and is electrically connected to the connectors 16 of the die 18. In some embodiments, the redistribution layer RDL1 is formed by the processes described as below.

Referring to FIG. 1F, after the polymer layer PM1 is formed, a plurality of openings 25 is formed in the polymer layer PM1 by, for example, a laser drilling process, exposure and development processes, for example. The openings 25 expose portions of the top surfaces of the connectors 16 of the die 18.

A seed layer 26 is then formed on the polymer layer PM1 by, for example, physical vapor deposition. The seed layer 26 is, for example, a copper seed layer or other metal seed layers. The seed layer 26 fills in the openings 25 and is in electrical contact with the connectors 16 of the die 18. In some embodiments, the seed layer 26 also fills in the defect region 24. In some other embodiments, the defect region 24 of the polymer layer PM1 is not completely filled with the seed layer 26, and a portion of the top surface of the protection layer 19 is still exposed by the defect region 24 after the seed layer 26 is formed.

Still referring to FIG. 1F, thereafter, a patterned mask layer 27 is formed over the carrier 10. The patterned mask layer 27 has a plurality of openings 27a, exposing a portion of the seed layer 26 in the openings 25 and on the top surface of the polymer layer PM1. The conductive layer 28 is then formed on the seed layer 26 exposed by the openings 27a through, for instance, an electroplating process. In some embodiments, the conductive layer 28 includes copper or other suitable metals.

Referring to FIG. 1F and FIG. 1G, the patterned mask layer 27 is removed by, for example, an ashing process or a stripping process. The seed layer 26 not covered by the conductive layer 28 is removed by an etching process with the conductive layer 28 as a mask, and a seed layer 26a underlying the conductive layer 28 is formed. The seed layer 26a and the conductive layer 28 form the redistribution layer RDL1.

In the embodiments of the disclosure, because the protection layer 19 is formed at least over the edge 10a of the carrier 10, and the adhesive layer 12 on the edge 10a of the carrier 10 is completely covered and protected by the protection layer 19 or/and the encapsulant 21a, therefore, when the polymer layer PM1 is formed with a defect region 24 in some embodiments, the adhesive layer 12 is protected and not exposed by the defect region 24, and the problem may occur due to the exposed adhesive layer in the defect region 24 is avoided. The details are described as below.

If the protection layer 19 is not formed, during the processes of forming the polymer layer PM1 and the redistribution layer RDL1, the adhesive layer 12 on the edge 10a of the carrier 10 may be exposed by the defect region 24, and may be damaged by the strip chemical used in the stripping process of the patterned mask layer 27. Specifically, in the cases that no protection layer is formed, a portion of the adhesive layer 12 exposed by the defect region 24 may be dissolved and removed by the strip chemical when stripping the patterned mask layer 27, while a portion of the adhesive layer 12 may be not dissolved completely, but form some undissolved adhesive residue apart from the surface of the de-bonding layer 11, and may drop on the seed layer 26, leading to a portion of the seed layer 26 not covered by the conductive layer 28 is covered by the undissolved adhesive residue during the removal process of the seed layer 26 described above. In other words, the undissolved adhesive residue serves as a mask of the seed layer 26 during the removal process of the seed layer 26. As a result, a portion of the seed layer 26 not covered by the conductive layer 28 is remained and forms a seed layer residue, which may affect the following processes and the reliability of the device. Compared to the cases that no protection layer is formed, the problem described above is avoided in the embodiments of the disclosure.

Figure 1H:
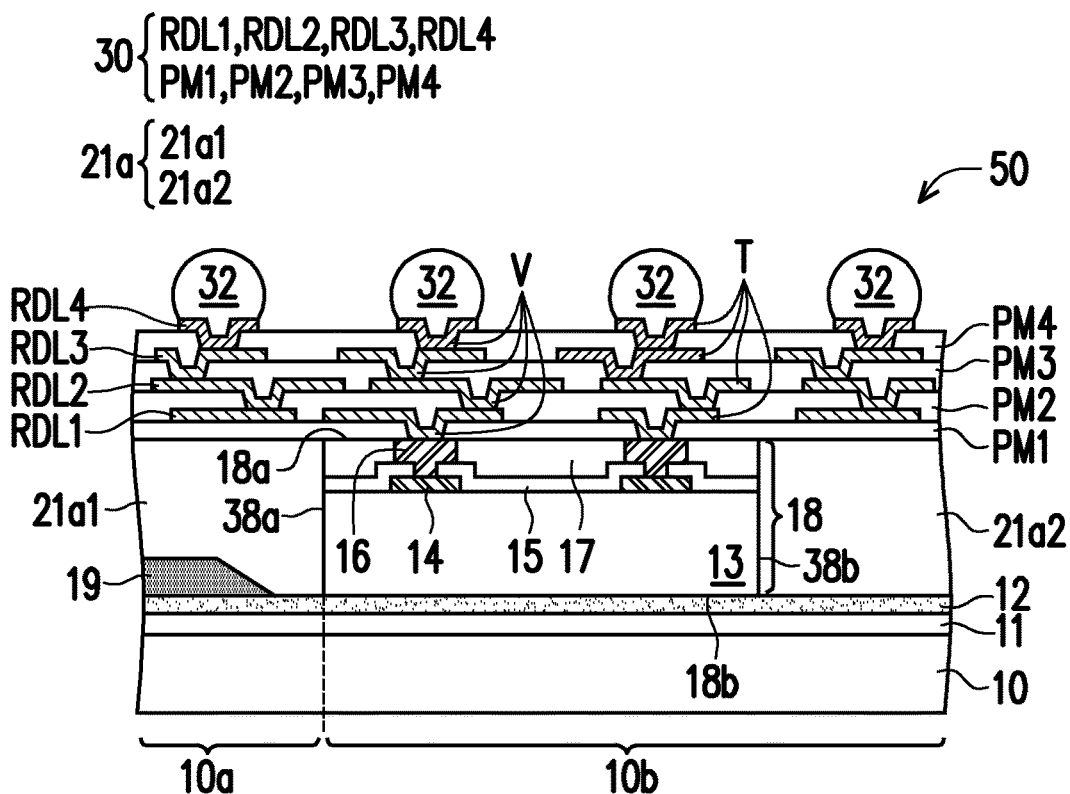

Referring to FIG. 1G and FIG. 1H, in some embodiments, after the polymer layer PM1 and the redistribution layer RDL1 are formed, polymer layers PM2, PM3, PM4, and redistribution layers RDL2, RDL3 and RDL4 stacked alternately are formed. The number of the polymer layers or the redistribution layers is not limited by the disclosure. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. The structural characteristics of the polymer layers PM2, PM3, PM4 and the redistribution layers RDL2, RDL3, RDL4 are substantially the same as those of the polymer layer PM1 and the redistribution layer RDL1. In some embodiments, the materials and the forming method of polymer layers PM2, PM3, PM4 and the redistribution layers RDL2, RDL3 and RDL4 are similar to or different from those of the polymer layer PM1 and the redistribution layer RDL1. It is mentioned that, for the sake of brevity, only a portion of the redistribution layer RDL1 on the connectors 16 of the die 18 is shown in FIG. 1G, and the seed layer 26a and the conductive layer 28 of RDL1 are not specifically shown in FIG. 1H.

In some embodiments, the redistribution layers RDL1, RDL2, RDL3 and RDL4 respectively includes a plurality of vias V and a plurality of traces T connected to each other. The vias V penetrates through the polymer layers PM1, PM2, PM3 and PM4 to connect the traces T of the redistribution layers RDL1, RDL1, RDL3 and RDL 4, and the traces T are respectively located on the polymer layers PM1, PM2, PM3 and PM4, and are respectively extending on the top surface of the polymer layers PM1, PM2, PM3 and PM4.

Referring to FIG. 1H, the polymer layers PM1, PM2, PM3, PM4 and the redistribution layers RDL1, RDL2, RDL3, RDL4 form a RDL structure 30 electrically connected to the die 18. In some embodiments, the redistribution layer RDL4 is also referred as an under-ball metallurgy (UBM) layer for ball mounting.

Thereafter, a plurality of connectors 32 are formed on redistribution layer RDL4 of the RDL structure 30. In some embodiments, the connectors 32 are referred as conductive terminals. The connectors 32 are electrically connected to the die 18 through the RDL structure 30. In some embodiments, the connectors 32 are made of a conductive material with low resistivity, such as Sn, Pb, Ag, Cu, Ni, Bi or an alloy thereof, and are formed by a suitable process such as ball placement process and reflow process. In alternative embodiments, the connectors 32 may be controlled collapse chip connection (i.e. C4) bumps formed by a C4 process.

Referring to FIG. 1H, a structure 50 is thus completed. The structure 50 includes the carrier 10, the die 18 attached to the carrier 10 though the adhesive layer 12, the encapsulant 21a, the protection layer 19, the RDL structure 30 and the connectors 32. The adhesive layer 12 on the edge 10a of the carrier 10 is completely covered and protected by the protection layer 19 and the encapsulant 21a. A portion of the protection layer 19 is sandwiched between the encapsulant 21a and the adhesive layer 12. For the sake of brevity, the inclined portion of the encapsulant 21a, a portion of the edge 10a adjacent to the end of the carrier 10 and the layers thereon are not shown in FIG. 1H. It is understood that in the embodiments in which a plurality of dies 18 are placed on the carrier 10, the die 18 shown in FIG. 1H is the die adjacent to the edge 10a of the carrier 10.

Figure 1I:
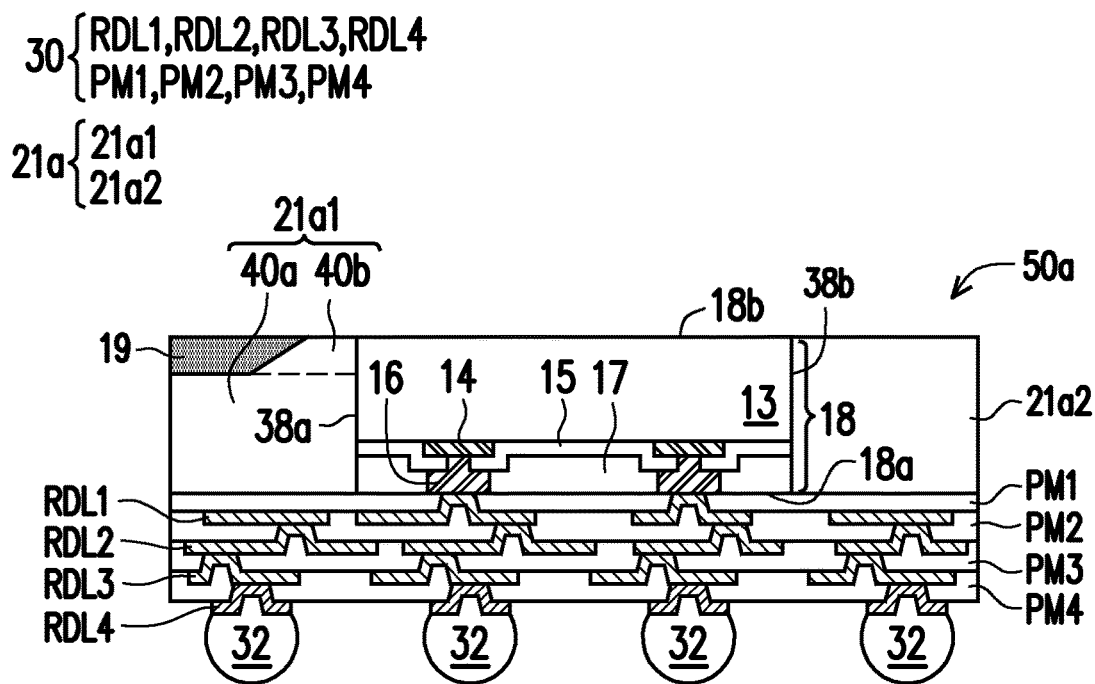

Referring to FIG. 1H and FIG. 1I, in some embodiments, the structure 50 is turned over, the de-bonding layer 11 is decomposed under the heat of light, and the carrier 10 is then released from the structure 50. In some embodiments, the adhesive layer 12 is then removed by a clean process, and the second surface 18b of the die 19 is exposed. A package structure 50a is thus completed. In some embodiments in which a plurality of dies 18 is formed over the carrier 10 in the forgoing process, after the carrier 10 is released, the package structure (not shown) may be singulated by a die-saw process to form a plurality of identical package structures 50a as illustrated in FIG. 1I, and portions of the layers on the edge 10a of the carrier 10 are removed during the die-saw process.

It is mentioned that, for the sake of brevity, only one sidewall of the die 18 adjacent to the edge 10a of the carrier 10 and the encapsulant 21a thereaside are shown in FIGS. 1A to 1G. In FIGS. 1H and 1I, two sidewalls of the die 18 and encapsulant 21a thereaside are shown. Specifically, the die 18 has a first sidewall 38a and a second sidewall 38b. The first sidewall 38a is the sidewall shown in FIGS. 1A to 1G. The second sidewall 38b is opposite to the first sidewall 38a, and not shown in FIGS. 1A to 1G.

The encapsulant 21a includes a first encapsulant 21a1 and a second encapsulant 21a2. The first encapsulant 21a1 is aside the first sidewall 38a of the die 18. The second encapsulant 21a2 is aside the second sidewall 38b of the die 18. The first encapsulant 21a1 and the second encapsulant 21a2 are asymmetrical with each other. In some embodiments, the first encapsulant 21a1 has a stepped structure, comprising a first step portion 40a and a second step portion 40b connected to each other. The second step portion 40b in located on the first step portion 40a, and between the protection layer 19 and the die 18, covering a portion of the top surface of the first step portion 40a. The protection layer 19 is located on the first portion 40a and aside the second step portion 40b, covering another portion of the top surface of the first step portion 40a. The protection layer 19 is in contact with the second step portion 40b, and is separated from the die 18 by the second step portion 40b therebetween.

In some embodiments, the top surface of the second step portion 40b, the top surface of the protection layer 19, and the second surface 18b of the die 18 are substantially coplanar with each other. The top surface of the first portion 40a is lower than the top surface of the second step portion 40b, and is covered by the protection layer 19 and the second step portion 40b.

In some embodiments, the protection layer 19 is only formed aside the first sidewall 38a of the die 18, and is not formed aside the second sidewall 38b of the die 18. That is to say, the second encapsulant 21a2 is not in contact with the protection layer 19, and does not have a stepped structure. In some embodiments, the top surface of the second encapsulant 21a2 is level with the second surface 18b of the die 18.

Figure 5:
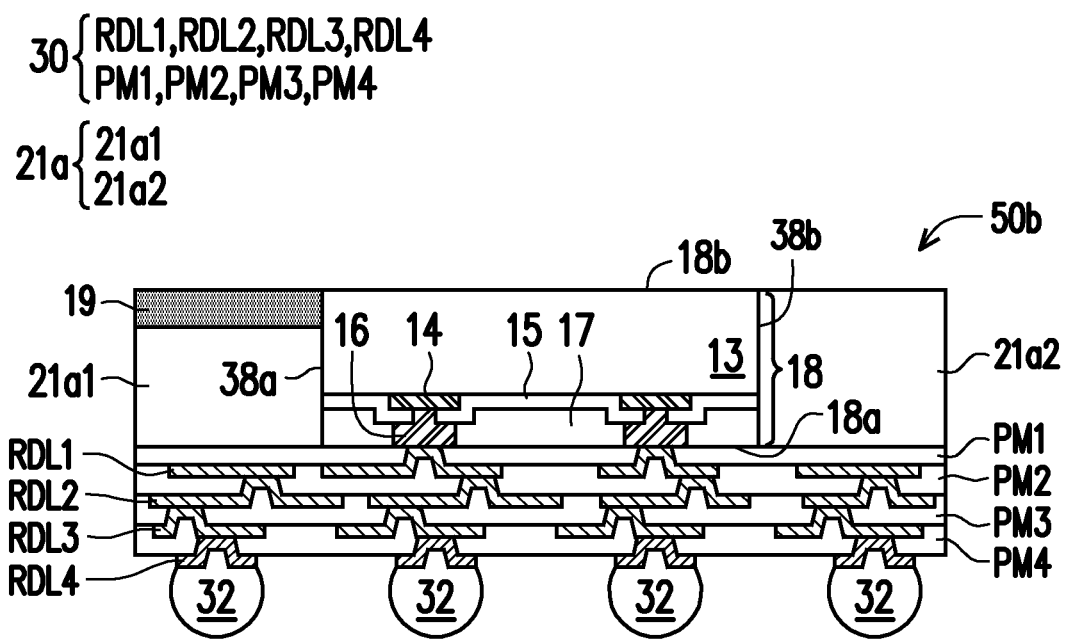
FIG. 5 illustrates an example of a package structure according to some embodiments of the disclosure.

Referring to FIG. 4B and FIG. 5, in some embodiments in which the protection layer 19 is formed to be in contact with the first sidewall 38a of the die 18, a package structure 50b is formed. In the package structure 50b, the first encapsulant 21a1 and the second encapsulant 21a2 are asymmetrical with each other. The top surface of the first encapsulant 21a1 is lower than the top surface of the second encapsulant 21a2. The first encapsulant 21a1 encapsulates a portion of the first sidewall 38a of the die 18. The second encapsulant 21a2 encapsulates the second sidewall 38b of the die 18. The protection layer 19 is on the first encapsulant 21a1 and aside the first sidewall 38a of the die 18, covering the top surface of the first encapsulant 21a1 and a portion of the first sidewall 38a of the die 18. In some embodiments, the top surface of the protection layer 19, the second surface 18b of the die 18, and the top surface of the second encapsulant 21a2 are coplanar with each other.

In some embodiments in which the encapsulant 21a is only in contact with a sidewall of the protection layer 19 (as shown in FIG. 4A), the protection layer 19 may be removed during the die-saw process, and not remain in the final package structure.

The package structure 50a/50b may further connect to other package components such as a printed circuit board (PCB), a flex PCB, or the like through the connectors 32.

FIG. 2A to FIG. 2G are schematic cross-sectional views illustrating a method of forming a package structure according to a second embodiment of the disclosure. The second embodiment differs from the first embodiment in that a protection layer 119a is formed. The structural characteristics of the protection layer 119a are different from those of the protection layer 19 in the first embodiment. The details are described as below.

Figure 2A:
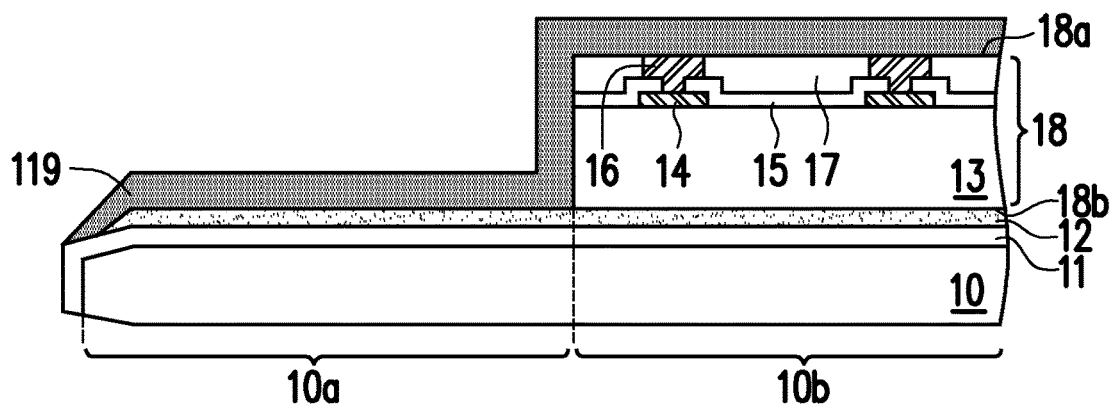
FIG. 2A to FIG. 2G are schematic cross-sectional views illustrating a method of forming a package structure according to a second embodiment of the disclosure.

Referring to FIG. 1A and FIG. 2A, after the die 18 is attached to the carrier 10 though the adhesive layer 12, a protection material layer 119 is formed over the carrier 10. In some embodiments, the protection material layer 119 is a conformal layer, that is, the protection layer 119 has a substantially equal thickness extending on the adhesive layer 12 and the die 18 over the carrier 10. The protection layer 119 covers the first surface 18a and the sidewalls of the die 18, the top surface and the sidewalls of the adhesive layer 12. The material and the thickness range of the protection material layer 119 is substantially the same as those of the protection layer 19. The protection material layer 119 may be formed by a suitable fabrication technique, such as spin coating, chemical vapor deposition, lamination, or the like.

Figure 2B:
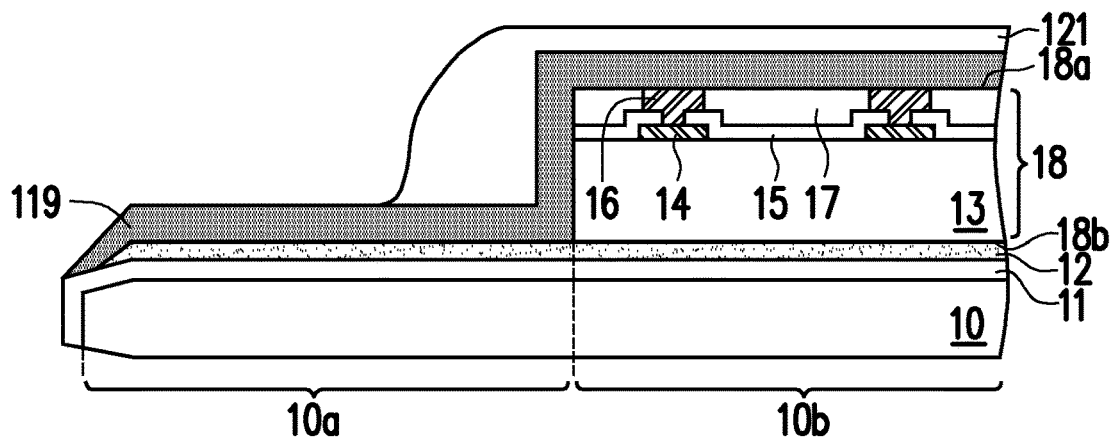

Referring to FIG. 2B, an encapsulant material layer 121 is formed on the protection material layer 119. The encapsulant material layer 121 covers the protection material layer 119 on the top and the sidewall of the die 18, and a portion of protection material layer 119 on the adhesive layer 12. The material and the forming method of the encapsulant material layer 121 are similar to those of the encapsulant material layer 21 (FIG. 1B), and is not described again.

Figure 2C:
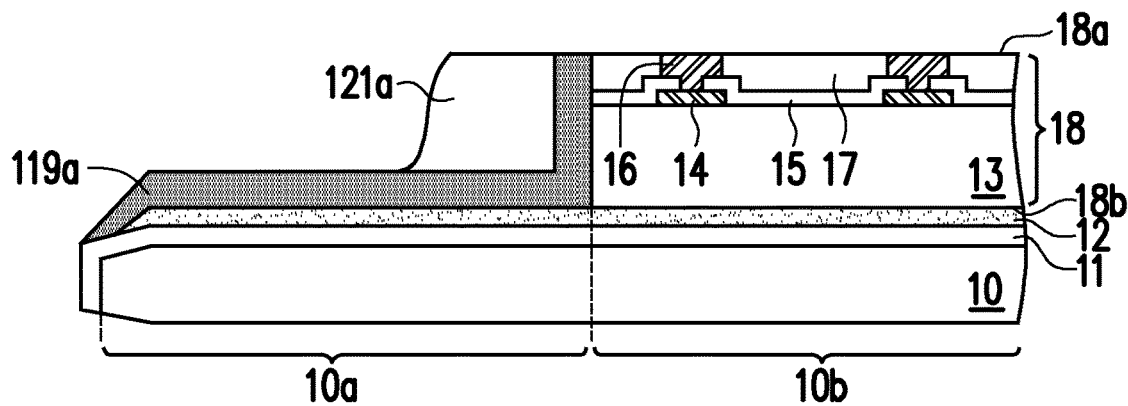

Referring to FIG. 2B and FIG. 2C, a planarization process is performed to remove a portion of the encapsulant material layer 121 and a portion of the protection material layer 119, such that the first surface 18a of the die 18 is exposed, and an encapsulant 121a and a protection layer 119a are formed. The planarization process includes a grinding process, a polishing process or the like, for example. In some embodiments, the top surface of the encapsulant 121a, the top surface of the protection layer 119a, and the first surface 18a of the die 18 are substantially coplanar with each other.

Referring to FIG. 2C, the protection layer 119a covers the sidewall and the top surface of the adhesive layer 12, and the sidewalls of the die 18. In some embodiments, the protection layer 119a is L-shaped. A portion of the protection layer 119a on the adhesive layer 12 over the edge 10a of the carrier 10 is not covered by the encapsulant 121a, but exposed. The other portion of the protection layer 119a on the adhesive layer 12 is sandwiched between the encapsulant 121a and the adhesive layer 12. A portion of the protection layer 119a at the sidewall of the die 18 is sandwiched between the encapsulant 121a and the die 18. In other words, the encapsulant 121a is located on the protection layer 119a and aside the die 18 and the protection layer 119a, encapsulating sidewalls of the protection layer 119a at the sidewalls of the die 18. The encapsulant 121a is separated from the die 18 and the adhesive layer 12 by the protection layer 119a therebetween. The bottom surface of the encapsulant 121a is higher than the second surface 18b of the die 18. In some embodiments, the adhesive layer 12 on the edge 10a of the carrier 10 is completely covered by and in contact with the protection layer 119a.

Figure 2D:
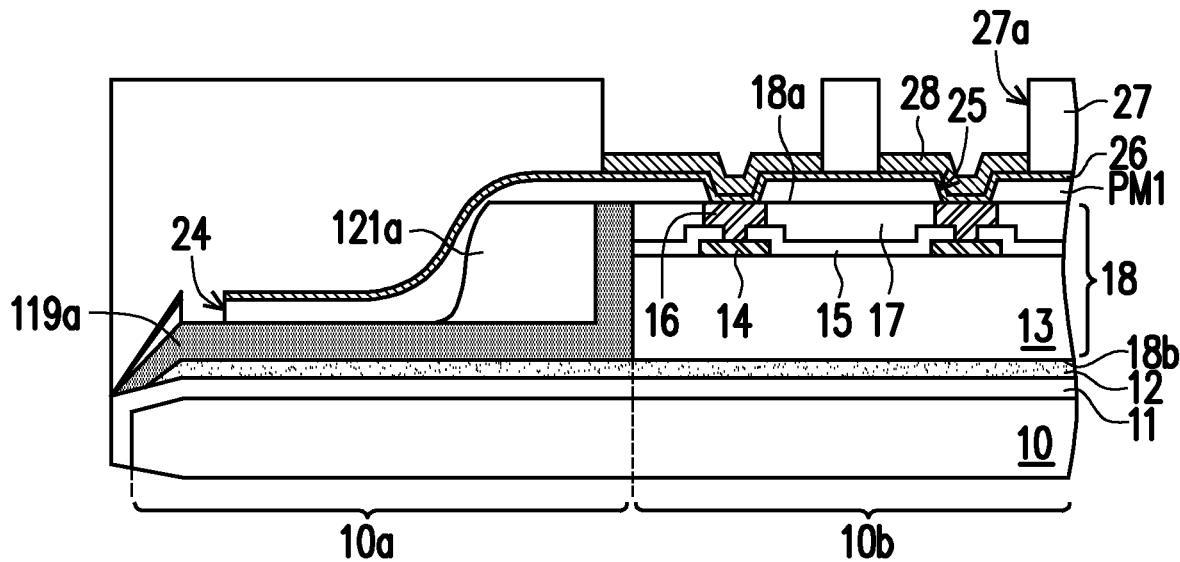
Figure 2E:
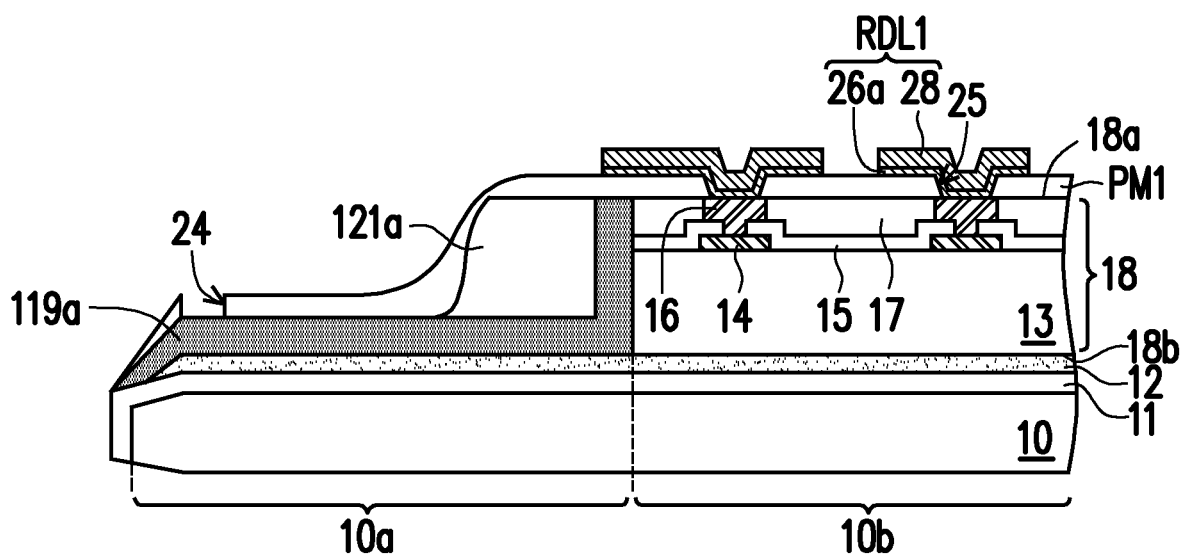

Referring to FIG. 2D and FIG. 2E, processes similar to those described in FIG. 1F and FIG. 1G are performed, so as to form a polymer layer PM1 and a redistribution layer RDL1 on the die 18. The redistribution layer RDL1 includes a seed layer 26a and a conductive layer 28.

Referring to FIG. 2D, the polymer layer PM1 is formed over the carrier 10 and the die 18. In some embodiments in which the polymer layer PM1 is formed by a high spin coating process, the polymer layer PM1 may include a defect region 24 over the edge 10a of the carrier 10, exposing a portion of the top surface of the protection layer 119a on the adhesive layer 12 over the edge 10a of the carrier 10. The adhesive layer 12 is covered by the protection layer 119a, and is not exposed by the defect region 24. Therefore, the problem may occur during the processes of forming the redistribution layer RDL1 due to the exposed adhesive is avoided.

Figure 2F:
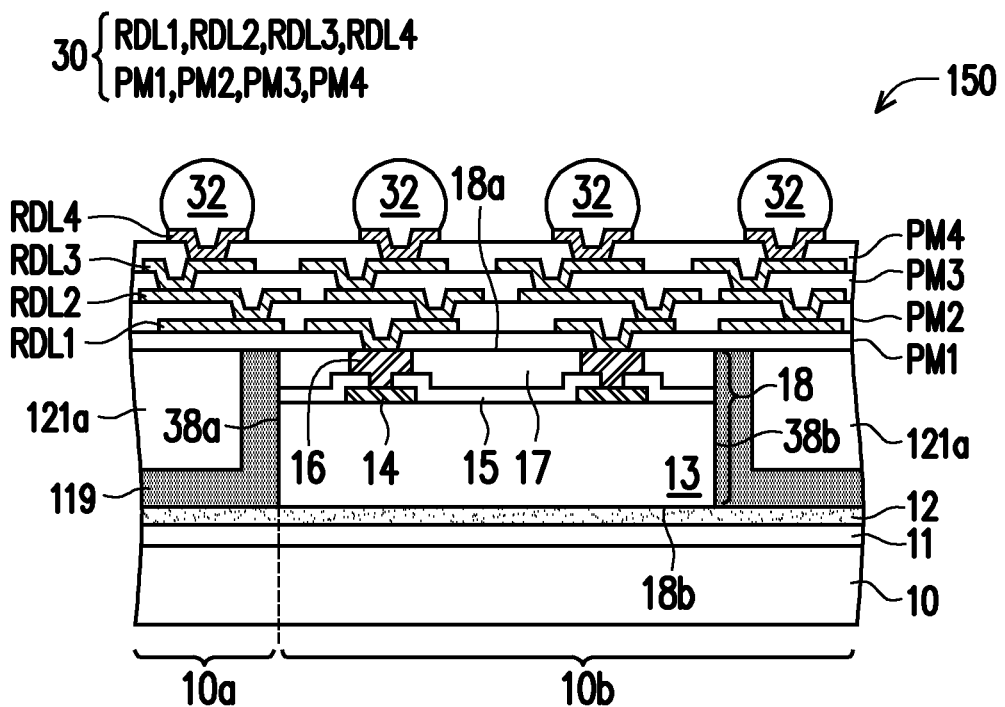

Referring to FIG. 2F, processes similar to those described in FIG. 1H are performed, so as to form a RDL structure 30 and a plurality of connectors 32. The RDL structure 30 includes polymer layers PM1, PM2, PM3, PM4 and redistribution layers RDL1, RDL2, RDL3, RDL4. The material, the forming method and the structural characteristics of the RDL structure 30 and the connectors 32 are similar to those of the first embodiment.

Still referring to FIG. 2F, a structure 150 is thus completed. For the sake of brevity, the inclined portion of the encapsulant 121a, and a portion of the edge 10a closest to the end of the carrier 10 and the layers thereon are not shown in FIG. 2F, it is understood that in the embodiments in which a plurality of dies 18 are placed on the carrier 10, the die 18 shown in FIG. 2F is the die adjacent to the edge 10a of the carrier 10.

The structure 150 includes the carrier 10, the die 18 attached to the carrier 10 though the adhesive layer 12, the encapsulant 121a, the protection layer 119a, the RDL structure 30 and the connectors 32. The structure 150 differs from the structure 50 in that the protection layer 119a is located between the encapsulant 121a and the adhesive layer 12, and between the encapsulant 121a and the die 18, the encapsulant 121a is separated from the adhesive layer 12 and the die 18 by the protection layer 119a therebetween. The other structural characteristics of the structure 150 are substantially the same as those of the structure 50, which is not described again.

Figure 2G:
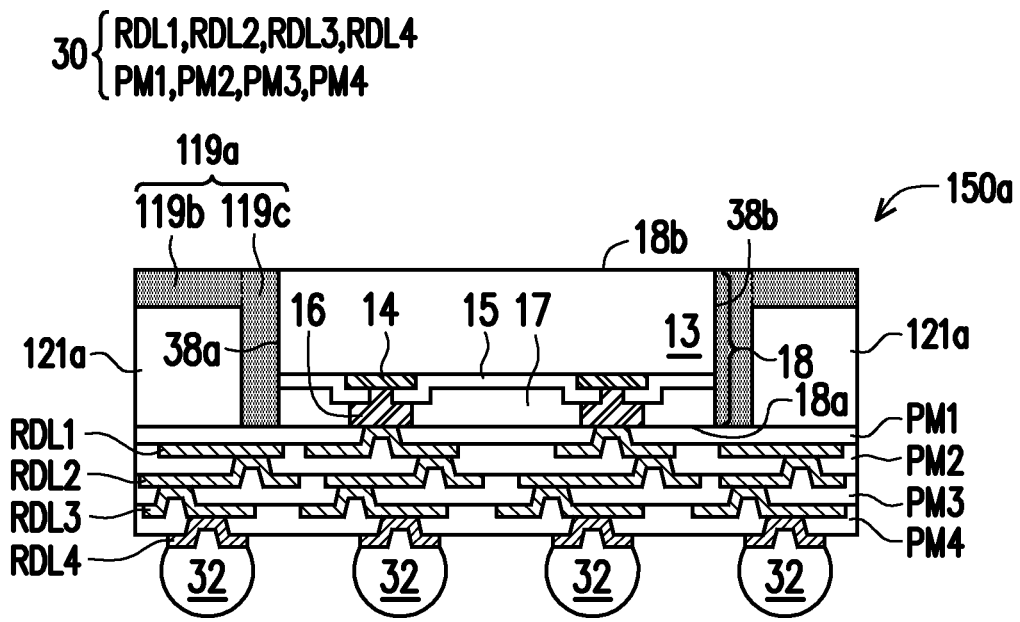

Referring to FIG. 2F and FIG. 2G, processes similar to those from FIG. 1H to FIG. 1I are performed, the structure 150 is turned over, the de-bonding layer 11 is decomposed under the heat of light, and the carrier 10 is then released from the structure 150. In some embodiments, the adhesive layer 12 is then removed by a clean process, and the second surface 18b of the die 18 is exposed. A package structure 150a is thus completed.

Referring to FIG. 2G, the protection layer 119a and the encapsulant 121a are aside the two sidewalls 38a and 38b of the die 18. In some embodiments, the protection layer 119a and the encapsulant 121a aside the first sidewall 38a of the die 18, and the protection layer 119a and the encapsulant 121a aside the second sidewall 38b of the die 18 are symmetrical to each other.

In some embodiments, the protection layer 119a includes a horizontal portion 119b and a vertical portion 119c connected to each other. The horizontal portion 119b is on the encapsulant 121a and aside the vertical portion 119c, and covers the top surface of the encapsulant 121a. The vertical portion 119c is located between the encapsulant 121a and the die 18, and between the horizontal portion 119b and the die 18, covering the sidewall of the encapsulant 121a and the sidewalls 38a/38b of the die 18. In some embodiments, the top surface of the horizontal portion 119b of the protection layer 119a and the top surface of the vertical portion 119c of the protection layer 119a are coplanar with the second surface 18b of the die 18. The bottom surface of the vertical portion 119c of the protection layer 119a, the bottom surface of the encapsulant 121a, and the first surface 18a of the die 18 are coplanar with each other, and are in contact with the polymer layer PM1 of the RDL structure 30.

In other words, the encapsulant 121a is separated from the die 18 by the protection layer 119a, and the top surface of the encapsulant 121a is lower than the second surface 18b of the die 18, and is covered by the protection layer 119a.

In some embodiments, the package structure 150a may further connect to other package components such as a printed circuit board (PCB), a flex PCB, or the like through the connectors 32.

Figure 6:
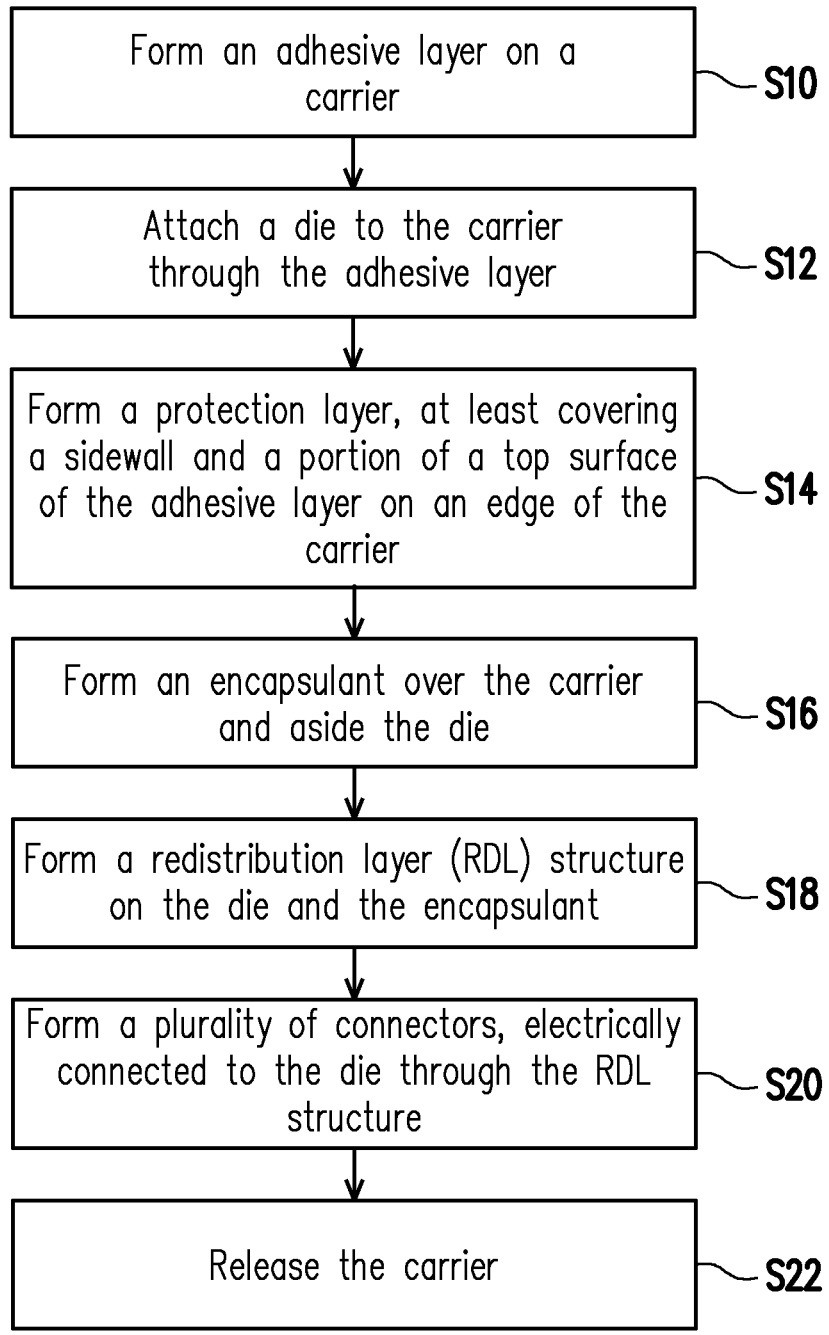
FIG. 6 is a flow chart of forming a package structure according to some embodiments of the disclosure.

FIG. 6 is a flow chart of a method of forming a package structure according to some embodiments of the disclosure. Referring to FIG. 6, in step S10, an adhesive layer is formed on a carrier. In step S12, a die is attached to the carrier through the adhesive layer. In step S14, a protection layer is formed, at least covering a sidewall and a portion of a top surface of the adhesive layer on an edge of the carrier. In step S16, an encapsulant is formed over the carrier and aside the die. In step S18, a RDL structure is formed on the die and the encapsulant. In step S20, a plurality of connectors are formed and electrically connected to the die through the RDL structure. In Step S22, the carrier is released.

In the embodiments of the disclosure, a protection layer is formed at least on the edge of the carrier. The adhesive layer on the edge of the carrier is covered and protected by the protection layer or/and the encapsulant. Therefore, even if a defect region of a polymer layer is formed on the edge of the carrier when the polymer layer of the RDL structure is formed, the problem of seed layer residue that may formed during the process of forming redistribution layer RDL1 is avoided.

In accordance with some embodiments of the disclosure, a method of manufacturing a package structure includes the following processes. An adhesive layer is formed on a carrier. A die is attached to the carrier through the adhesive layer. A protection layer is formed to at least cover a sidewall and a portion of a top surface of the adhesive layer on an edge of the carrier. An encapsulant is formed over the carrier to laterally encapsulate the die. A redistribution layer (RDL) structure is formed on the die and the encapsulant. A connector is formed to electrically connect to the die through the RDL structure. The carrier is released.

In accordance with alternative embodiments of the disclosure, a method of manufacturing a package structure includes the following processes. A carrier having an adhesive layer formed thereon is provided. The adhesive layer includes an edge portion over an edge of the carrier. A die is attached to a die region of the carrier through the adhesive layer. A protection layer is formed to cover the edge portion of the adhesive layer. An encapsulant is formed to laterally encapsulate the die. A polymer layer is formed on the die, the encapsulant and the protection layer, wherein the edge portion of the adhesive layer is separate from the polymer layer by the protection layer therebetween. A redistribution layer is formed to penetrate through the polymer layer to connect to a connector of the die.

In accordance with alternative embodiments of the disclosure, a method of manufacturing a package structure includes the following processes. A carrier is provided. A die is attached to the carrier through an adhesive layer. An encapsulant is formed on the adhesive layer to laterally encapsulate the die, wherein a portion of the adhesive layer is not covered by the encapsulant and the die. A protection layer is formed to at least cover the portion of the adhesive layer. A RDL structure is formed on the encapsulant and the die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of manufacturing a package structure, comprising:
    forming an adhesive layer on a carrier;
    attaching a die to the carrier through the adhesive layer;
    forming a protection layer, at least covering a sidewall and a portion of a top surface of the adhesive layer on an edge of the carrier;
    forming an encapsulant over the carrier to laterally encapsulate the die;
    forming a redistribution layer (RDL) structure on the die and the encapsulant;
    forming a connector, electrically connected to the die through the RDL structure; and
    releasing the carrier.

2. The method of claim 1, wherein a gap is formed between the protection layer and the die, exposing another portion of the top surface of the adhesive layer on the edge of the carrier.

3. The method of claim 2, wherein the encapsulant is formed to encapsulate a sidewall of the die, and fill in the gap to cover the another portion of the top surface of the adhesive layer exposed by the gap.

4. The method of claim 1, wherein the protection layer further extends to contact a portion of a sidewall of the die, the encapsulant is formed on the protection layer to encapsulant another portion of the sidewall of the die.

5. The method of claim 1, wherein forming the protection layer and the encapsulant comprises:
    forming a protection material layer over the carrier, the protection material layer covers a first surface and sidewalls of the die, and the top surface and the sidewall of the adhesive layer;
    forming an encapsulant material layer on the protection material layer, the encapsulant material layer covers the protection material layer on the first surface and the sidewalls of the die, and a portion of the protection material layer on the adhesive layer over the edge of the carrier; and
    performing a planarization process to remove a portion of the protection material layer and a portion of the encapsulant material layer over the first surface of the die, so as to expose the first surface of the die.

6. The method of claim 5, wherein after the planarization process is performed, the protection layer is vertically between the encapsulant and the adhesive layer, and laterally between the encapsulant and the die, and covers the sidewall and the top surface of the adhesive layer on the edge of the carrier.

7. The method of claim 1, wherein forming the RDL structure comprises:
    forming a polymer layer on the die, the encapsulant and the protection layer over the carrier;
    forming a seed layer on the polymer layer, the seed layer fills in an opening of the polymer layer to connect to the die;
    forming a patterned mask layer on the polymer layer to cover a portion of the seed layer;
    forming a conductive layer on the seed layer exposed by the patterned mask layer; and
    removing the patterned mask layer.

8. The method of claim 7, wherein the polymer layer has a defect region over the edge of the carrier, and a portion of the protection layer is exposed by the defect region.

9. The method of claim 8, wherein the adhesive layer directly below the defect region of the polymer layer is protected by the protection layer when removing the patterned mask layer.

10. A method of manufacturing a package structure, comprising:
    providing a carrier having an adhesive layer formed thereon, the adhesive layer comprises an edge portion over an edge of the carrier;
    attaching a die to a die region of the carrier through the adhesive layer;
    forming a protection layer to cover the edge portion of the adhesive layer;
    forming an encapsulant to laterally encapsulate the die;
    forming a polymer layer on the die, the encapsulant and the protection layer, wherein the edge portion of the adhesive layer is separate from the polymer layer by the protection layer therebetween; and
    forming a redistribution layer penetrating through the polymer layer to connect to a connector of the die.

11. The method of claim 10, wherein the polymer layer comprises a defect region which is an opening directly over the edge portion of the adhesive layer, the opening exposes a portion of the protection layer without exposing the adhesive layer.

12. The method of claim 11, wherein forming the redistribution layer comprises:
    patterning the polymer layer to form a first opening exposing the connector of the die;
    forming a seed layer on the polymer layer and filling into the first opening to connect to the connector of the die;

forming a patterned mask layer over the carrier, the patterned mask layer has a second opening exposing a portion of the seed layer, wherein a portion of the pattered mask layer is in contact with the portion of the protection layer exposed by the defect region, and separate from the adhesive layer by the protection layer therebetween;

forming a conductive layer on the portion of the seed layer exposed by the patterned mask layer; and removing the patterned mask layer by a stripping process.

13. The method of claim 12, wherein the stripping process uses a strip chemical to remove the patterned mask layer, and the edge portion of the adhesive layer is protected by the protection layer from the strip chemical.

14. The method of claim 10, wherein the encapsulant is formed to cover a portion of the protection layer, and a portion of the encapsulant is between the protection layer and the polymer layer.

15. The method of claim 10, further comprising:
releasing the carrier;
performing a singulation process to singulate the package structure, wherein a portion of the protection layer is remained in the package structure after performing the singulation process; and
removing the adhesive layer by a cleaning process.

16. A method of manufacturing a package structure, comprising:

providing a carrier;

attaching a die to the carrier through an adhesive layer;

forming an encapsulant on the adhesive layer to laterally encapsulate the die, wherein a portion of the adhesive layer is not covered by the encapsulant and the die;

forming a protection layer to at least cover the portion of the adhesive layer; and forming a RDL structure on the encapsulant and the die, wherein forming the RDL structure comprises forming a polymer layer over the carrier and extending along surfaces of the protection layer, the encapsulant and the die, and the portion of the adhesive layer is separated from the polymer layer by the protection layer therebetween.

17. The method of claim 16, wherein the protection layer is formed before forming the encapsulant, and a portion of the protection layer is formed to be sandwiched between the encapsulant and the adhesive layer.

18. The method of claim 17, wherein another portion of the protection layer is formed to be sandwiched between the encapsulant and the die.

19. The method of claim 16, wherein the polymer layer and the protection layer are formed of a same material.

20. The method of claim 16, wherein the portion of the adhesive layer is located on an edge of the carrier and completely covered by the protection layer.

* * * * *